(12) United States Patent
Pendharkar (10) Patent No.: US 9,362,398 B2
(45) Date of Patent: Jun. 7, 2016

(54) LOW RESISTANCE LDMOS WITH REDUCED GATE CHARGE

(75) Inventor: Sameer P. Pendharkar, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 293 days.

(21) Appl. No.: 13/281,274

(22) Filed: Oct. 25, 2011

(65) Prior Publication Data

US 2012/0098065 A1 Apr. 26, 2012

Related U.S. Application Data

(60) Provisional application No. 61/406,645, filed on Oct. 26, 2010.

(51) Int. Cl.
| | | |
|---|---|---|
| H01L 29/66 | (2006.01) | |
| H01L 29/78 | (2006.01) | |
| H01L 29/06 | (2006.01) | |
| H01L 29/40 | (2006.01) | |
| H01L 29/423 | (2006.01) | |

(52) U.S. Cl.
CPC ........ H01L 29/7835 (2013.01); H01L 29/0653 (2013.01); H01L 29/402 (2013.01); H01L 29/66659 (2013.01); H01L 29/4238 (2013.01)

(58) Field of Classification Search
USPC .................. 257/367, 328, 335, E29.027, 409; 438/296, 430
See application file for complete search history.

(56) References Cited

U.S. PATENT DOCUMENTS

| | | | | |
|---|---|---|---|---|
| 5,844,275 A | * | 12/1998 | Kitamura et al. | 257/335 |
| 6,492,678 B1 | * | 12/2002 | Hebert | H01L 29/402 257/138 |
| 7,745,294 B2 | * | 6/2010 | Pendharkar et al. | 438/286 |
| 7,777,278 B2 | * | 8/2010 | Hirler et al. | 257/367 |
| 7,888,732 B2 | * | 2/2011 | Denison et al. | 257/328 |

(Continued)

FOREIGN PATENT DOCUMENTS

| | | |
|---|---|---|
| CN | 101471380 A | 7/2009 |
| KR | 20100038603 A | 4/2010 |

OTHER PUBLICATIONS

Chinese Publ. No. cited in corresponding Chinese Publication No. CN 103189988 A, Search Report dated May 26, 2015.
CN101471380A, English Machine Translation (8 pages).

Primary Examiner — Bradley K Smith
Assistant Examiner — David Goodwin
(74) Attorney, Agent, or Firm — Andrew Viger; Frank D. Cimino (57) ABSTRACT

An integrated circuit containing an MOS transistor with a drain drift region adjacent to the channel region, a field oxide element in the drain region, a first gate section over the channel region and a second gate section over the field oxide element, with a gap between the gate sections so that at least half of the drift region is not covered by gate. A process of forming an integrated circuit containing an MOS transistor with a drain drift region adjacent to the channel region, a field oxide element in the drain region, a first gate section over the channel region and a second gate section over the field oxide element, with a gap between the gate sections so that at least half of the drift region is not covered by gate, so that the source/drain implant is blocked from the drift region below the gap.

9 Claims, 8 Drawing Sheets

(56) References Cited

U.S. PATENT DOCUMENTS

| | | | |
|---|---|---|---|
| 7,910,991 B2 | 3/2011 | Yang et al. | |
| 8,004,039 B2 * | 8/2011 | Zinn | 257/339 |
| 8,174,071 B2 * | 5/2012 | Tien | H01L 29/4236 257/343 |
| 8,299,547 B2 * | 10/2012 | Abou-Khalil et al. | 257/409 |
| 2008/0182394 A1 | 7/2008 | Yang et al. | |
| 2009/0244928 A1 | 10/2009 | Yang et al. | |
| 2009/0273029 A1 * | 11/2009 | Tien et al. | 257/336 |
| 2009/0283825 A1 * | 11/2009 | Wang et al. | 257/335 |
| 2010/0117150 A1 * | 5/2010 | Pendharkar et al. | 257/337 |
| 2010/0213517 A1 * | 8/2010 | Sonsky et al. | 257/288 |
| 2012/0091526 A1 * | 4/2012 | Tang et al. | 257/339 |
| 2012/0104493 A1 * | 5/2012 | Denison et al. | 257/339 |
| 2013/0009225 A1 * | 1/2013 | Kocon | 257/296 |

* cited by examiner

LOW RESISTANCE LDMOS WITH REDUCED GATE CHARGE

This application claims the benefit of U.S. Provisional Application No. 61/406,645, filed Oct. 26, 2010, the entirety of which is herein incorporated by reference.

FIELD OF THE INVENTION

This invention relates to the field of integrated circuits. More particularly, this invention relates to MOS transistors in integrated circuits.

BACKGROUND OF THE INVENTION

An integrated circuit may contain a metal oxide semiconductor (MOS) transistor with a drift region in the drain region adjacent to the channel region, such as a laterally diffused metal oxide semiconductor (LDMOS) transistor, a diffused metal oxide semiconductor (DMOS) transistor or a drain extended metal oxide semiconductor (DEMOS) transistor. A field oxide element in the drain region is located between the drift region and a drain contact region. The gate of the MOS transistor extends from the source region over the channel region and the drift region and overlaps the field oxide element. Capacitance due to overlap of the gate with the drift region increases a total gate capacitance, which may undesirably reduce a maximum effective operating frequency of the MOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes an MOS transistor with a drift region in the drain region of the MOS transistor adjacent to the channel region of the MOS transistor and a drain insulator in the drain region adjacent to the drift region opposite the channel region. The gate of the MOS transistor is formed in two sections; the first gate section is located over the channel region and the second gate section is located over the drain insulator. At least half of the drift region is not covered by the gate. In a first product embodiment, the first gate section is free of connecting elements of gate material to the second gate section over the drift region. In a second product embodiment, the first gate section is connected to the second gate section by elements of gate material. A process of forming the integrated circuit is also described.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
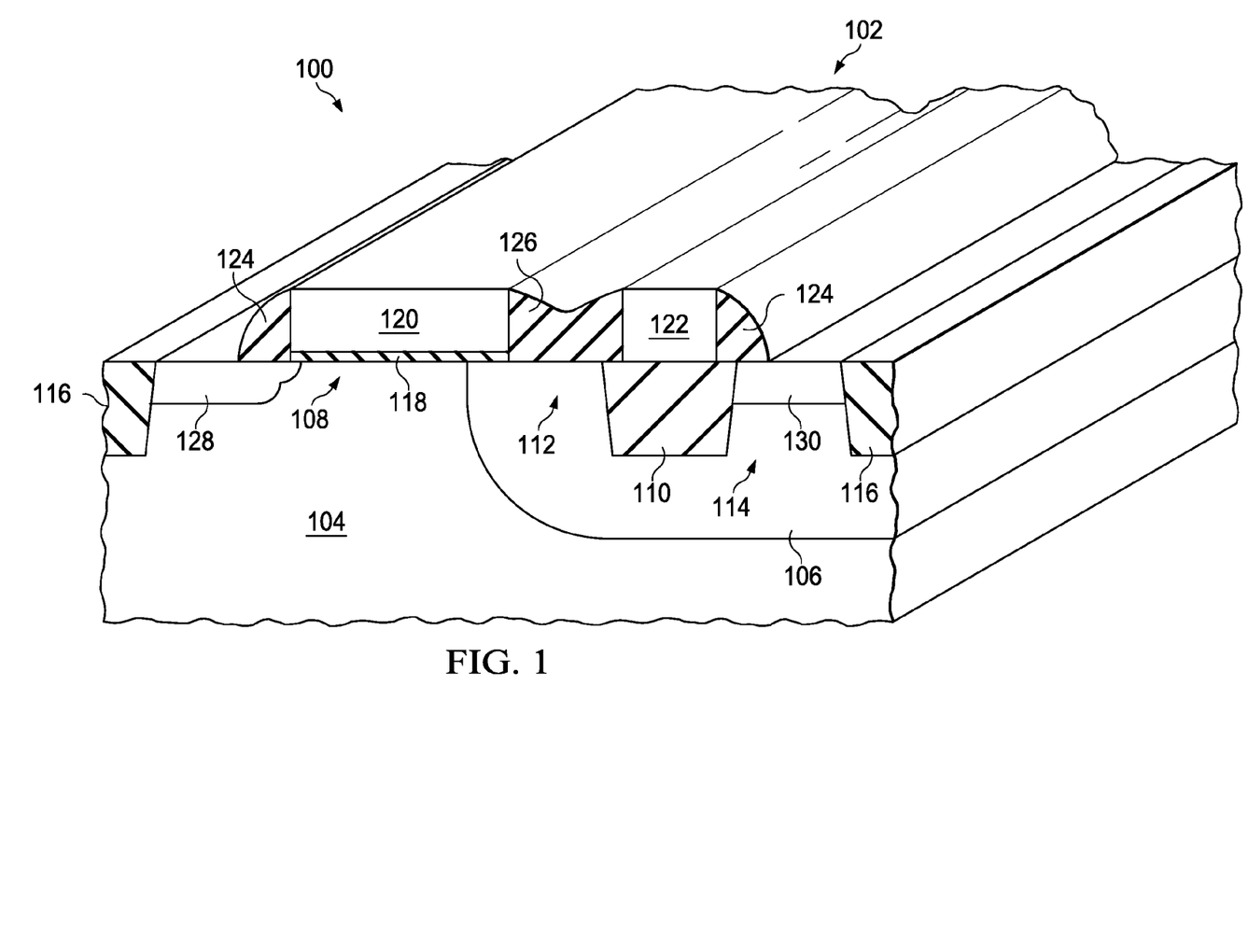
FIG. 1 depicts an integrated circuit containing an MOS transistor formed according to a first product embodiment.

FIG. 1 depicts an integrated circuit 100 containing an MOS transistor 102 formed according to a first product embodiment. The integrated circuit 100 is formed in and on a substrate 104. The MOS transistor 102 includes a drain region 106 formed in the substrate 104 adjacent to a channel region 108 of the MOS transistor 102. A drain insulator 110 is formed in the drain region 106. The drain insulator 110 may be, for example, en element of field oxide. A portion of the drain region 106 between the drain insulator 110 and the channel region 108 is a drift region 112. A portion of the drain region 106 adjacent to the drain insulator 110 opposite the drift region 112 is a drain contact region 114. Additional field oxide elements 116 may be formed in the substrate 104 adjacent to the MOS transistor 102.

A gate dielectric layer 118 is formed on a top surface of the substrate 104 over the channel region 108. A first gate section 120 is formed on a top surface of the gate dielectric layer 118 over the channel region 108, optionally overlapping the drift region 112. A second gate section 122 is formed over the drain insulator 110. In one version of the first product embodiment, the second gate section 122 does not overlap the drift region 112. At least half the drift region 112 is not covered by gate material. In one version of the first product embodiment, the first gate section 120 is not connected to the second gate section 122 by any gate material over the drift region 112.

Sidewalls 124 may be formed on lateral surfaces of the first gate section 120 and the second gate section 122 farthest from the drift region 112. Sidewall material 126 may optionally be formed on lateral surfaces of the first gate section 120 and the second gate section 122 closest to the drift region 112, and may block a portion or all of source/drain implants from the drift region 112 below the gap between the first gate section 120 and the second gate section 122.

A source region 128 of the MOS transistor 102 is formed in the substrate 104 adjacent to the first gate section 120. A heavily doped drain contact layer 130 may be formed in the drain contact region 114.

Formation of the MOS transistor 102 including the first gate section 120 and the second gate section 122 so that at least half the drift region 112 is not covered by gate material may desirably reduce a gate-drain capacitance while providing a desired operating drain voltage of the MOS transistor 102. Reduced gate-drain capacitance may, for example, advantageously allow faster switching of the MOS transistor 102. In one version of the instant embodiment, the second gate section 122 may be configured to be biased separately from the first gate section 120, which may advantageously allow the MOS transistor 102 to be operated at a higher drain voltage compared to embodiments in which the second gate section 122 is electrically connected to the first gate section 120.

Figure 2:
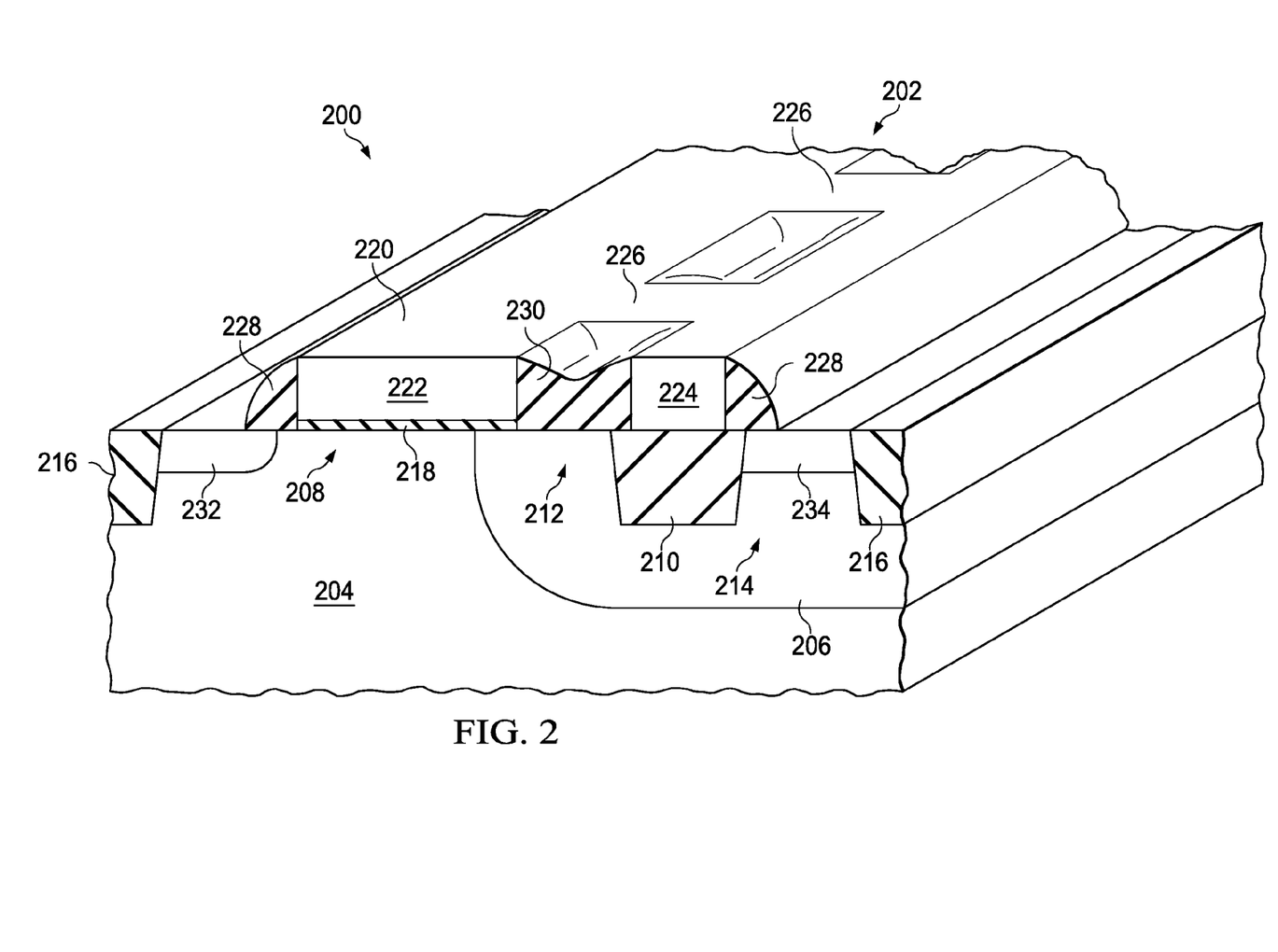
FIG. 2 depicts an integrated circuit containing an MOS transistor formed according to a second product embodiment.

FIG. 2 depicts an integrated circuit 200 containing an MOS transistor 202 formed according to a second product embodiment. The integrated circuit 200 is formed in and on a substrate 204. The MOS transistor 202 includes a drain region 206 adjacent to a channel region 208 and a drain insulator 210 as described in reference to FIG. 1. The drain region 206 includes a drift region 212 and a drain contact region 214 as described in reference to FIG. 1. Additional field oxide elements 216 may be formed in the substrate 204 adjacent to the MOS transistor 202.

A gate dielectric layer 218 is formed on a top surface of the substrate 204 over the channel region 208 and the drift region 212. A gate 220 is formed on a top surface of the gate dielectric layer 218 and over the drain insulator 210. The gate 220 includes a first gate section 222 over the channel region 208, a second gate section 224 over the drain insulator 210, and two or more gate connecting elements 226 formed of the same material as the first gate section 222 to the second gate section 224 which connect the first gate section 222 to the second gate section 224. Each gate connecting element 226 is separated from immediately adjacent gate connecting elements 226 by less than 2 microns. At least half the drift region 212 is not covered by the gate 220. In one version of the second product embodiment, the second gate section 224 does not overlap the drift region 212.

Sidewalls 228 may be formed on lateral surfaces of the first gate section 222 and the second gate section 224 farthest from the drift region 212. Sidewall material 230 may optionally be formed on lateral surfaces of the first gate section 222, the second gate section 224 and the gate connecting elements 226 closest to the drift region 212, and may block a portion or all of source/drain implants from the drift region 212 below gaps between the first gate section 222, the second gate section 224 and the gate connecting elements 226.

A source region 232 of the MOS transistor 202 is formed in the substrate 204 adjacent to the first gate section 222. A heavily doped drain contact layer 234 may be formed in the drain contact region 214.

Formation of the MOS transistor 202 so that at least half the drift region 212 is not covered by gate material may desirably reduce a gate-drain capacitance. Reduced gate-drain capacitance may, for example, advantageously allow faster switching of the MOS transistor 202. Forming the gate 220 to have gate connecting element 226 separated from immediately adjacent gate connecting elements 226 by less than 2 microns may reduce an electric field in the gate dielectric layer 218, advantageously allowing the MOS transistor 202 to be operated at a higher drain voltage than a similar MOS transistor without the gate connecting element 226 so configured.

FIG. 3A through FIG. 3D are cross-sections of an integrated circuit containing an MOS transistor as described in reference to either the first product embodiment or the second product embodiment, formed according to a first process embodiment, depicted in successive stages of fabrication. The integrated circuit 300 is formed in and on a substrate 302, which may be a single crystal silicon wafer, a silicon-on-insulator (SOI) wafer, a hybrid orientation technology (HOT) wafer with regions of different crystal orientations, or other material appropriate for fabrication of the integrated circuit 300. A drain region 304 formed in the substrate 302, for example by ion implanting a drain set of dopants into the substrate and performing a thermal drive to diffuse the drain set of dopants to a desired depth and lateral extent. In an n-channel version of the MOS transistor, the drain set of dopants includes n-type dopants, for example phosphorus, arsenic and/or antimony. In a p-channel version of the MOS transistor, the drain set of dopants includes p-type dopants, for example boron, gallium and/or indium. The drain region 304 is located abutting a channel region 306 of the MOS transistor.

Figure 3A:
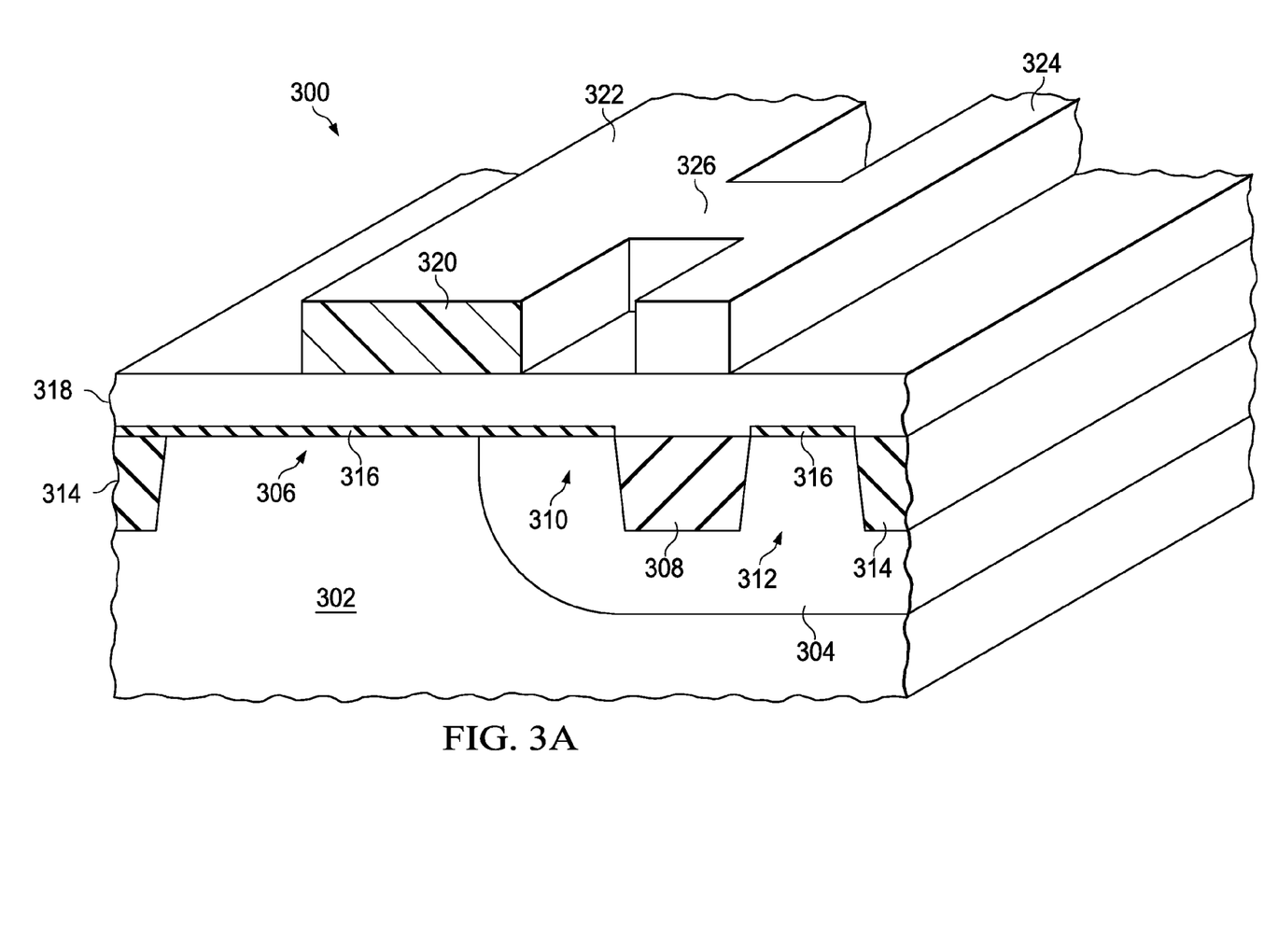
FIG. 3A through FIG. 3D are cross-sections of an integrated circuit containing an MOS transistor as described in reference to either the first product embodiment or the second product embodiment, formed according to a first process embodiment, depicted in successive stages of fabrication.

A drain insulator 308 is formed in the drain region 304. The drain insulator 308 may be, for example, an element of field oxide. The field oxide may be, for example, primarily composed of silicon dioxide 250 to 600 nanometers thick. The field oxide elements may be formed by shallow trench isolation (STI) processes as depicted in FIG. 1A, by local oxidation of silicon (LOCOS) processes, or by other methods. An STI process may include the steps of: forming an oxide layer on the substrate 302, forming a silicon nitride layer on the oxide layer, patterning the silicon nitride layer so as to expose an area for the field oxide, etching a trench in the substrate 302 in the exposed area to an appropriate depth for a desired thickness of the field oxide, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer. A LOCOS process may include the steps of: forming an oxide layer on the substrate 302, forming a silicon nitride layer on the oxide layer, patterning the silicon nitride layer so as to expose an area for the field oxide, growing thermal oxide at the top surface of the substrate 302 in the exposed area to an appropriate thickness for a desired thickness of the field oxide, and removing the silicon nitride layer. Additional field oxide elements 314 may be formed in the substrate 302 adjacent to the MOS transistor.

A gate dielectric layer 316 is formed on a top surface of the substrate 302. The gate dielectric layer 316 may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer 316 may include nitrogen as a result of exposure to a nitrogen containing plasma or a nitrogen containing ambient gas at temperatures between 50 C. and 800 C. The gate dielectric layer 316 may be between 1 and 10 nanometers thick. The gate dielectric layer 316 may be formed by any of a variety of gate dielectric formation processes, for example thermal oxidation, plasma nitridation of an oxide layer, and/or dielectric material deposition by atomic layer deposition (ALD).

A gate layer 318, for example polycrystalline silicon between 50 and 1000 nanometers thick, is formed on a top surface of the gate dielectric layer 316 and over the drain insulator 308. A gate photoresist pattern 320 is formed over the gate layer 318. The gate photoresist pattern 320 includes a first gate section pattern 322 over the channel region 306. The gate photoresist pattern 320 includes a second gate section pattern 324 over the drain insulator 308. In some versions of the first process embodiment, the second gate section pattern 324 does not overlap the drift region 310. The gate photoresist pattern 320 may also include one or more gate connection element patterns 326 which connect the first gate section pattern 322 and the second gate section pattern 324. At least half the drift region 310 is not covered by the gate photoresist pattern 320. In a subsequent gate etch operation, not shown, gate material outside the gate photoresist pattern 320 is removed from the gate layer 318. After the gate etch operation is completed, the gate photoresist pattern 320 is removed.

Figure 3B:
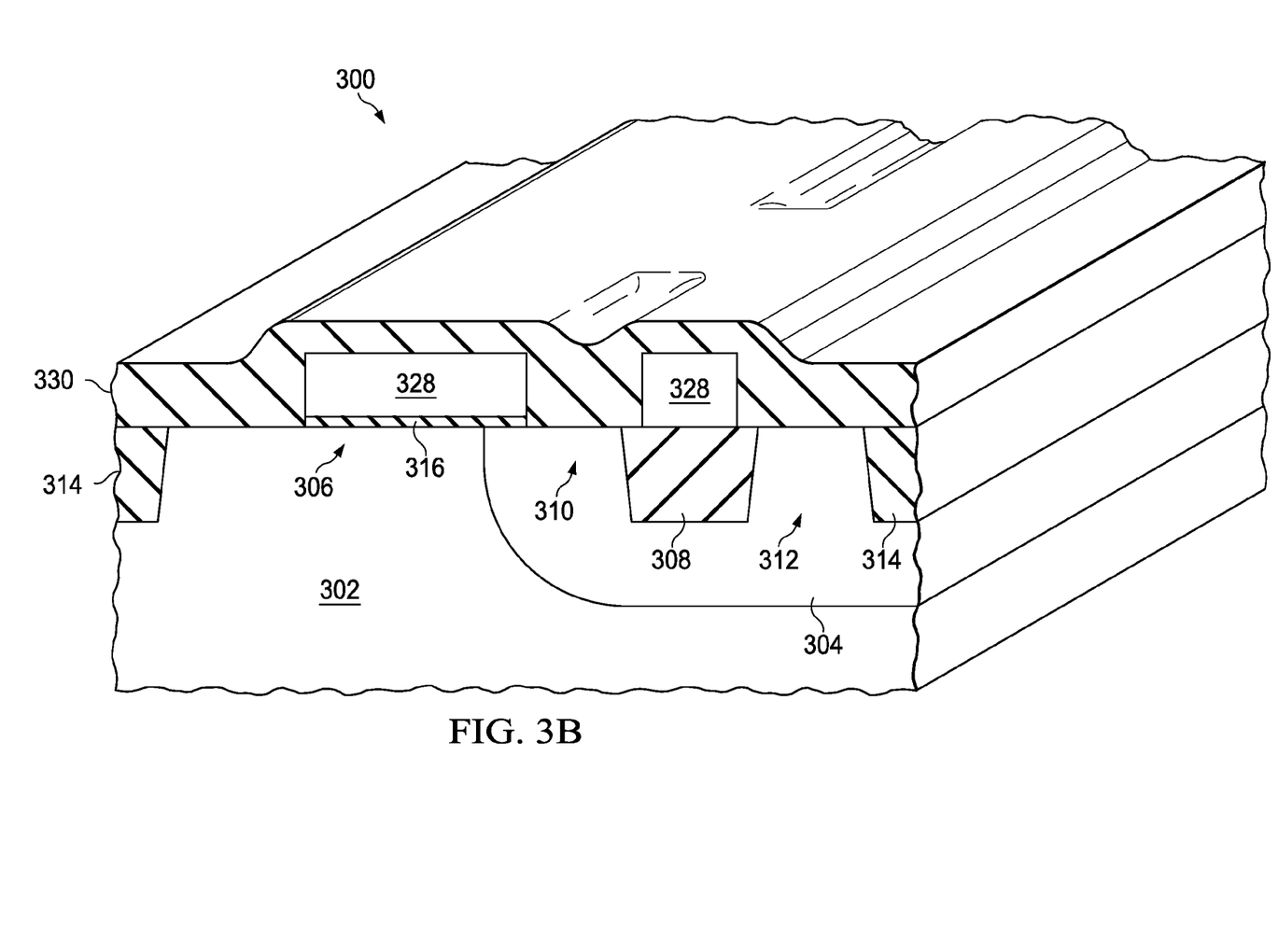

Referring to FIG. 3B, a gate 328 is formed from the gate layer 318 of FIG. 3A by the gate etch operation. A conformal layer of sidewall material 330, for example one or more conformal layers of silicon nitride and/or silicon dioxide, is formed over the integrated circuit 300. In the first process embodiment, a minimum thickness of the sidewall material layer 330 directly over the drift region 310, that is not over the gate 328, is at least 50 percent of an average thickness of the gate 328.

Figure 3C:
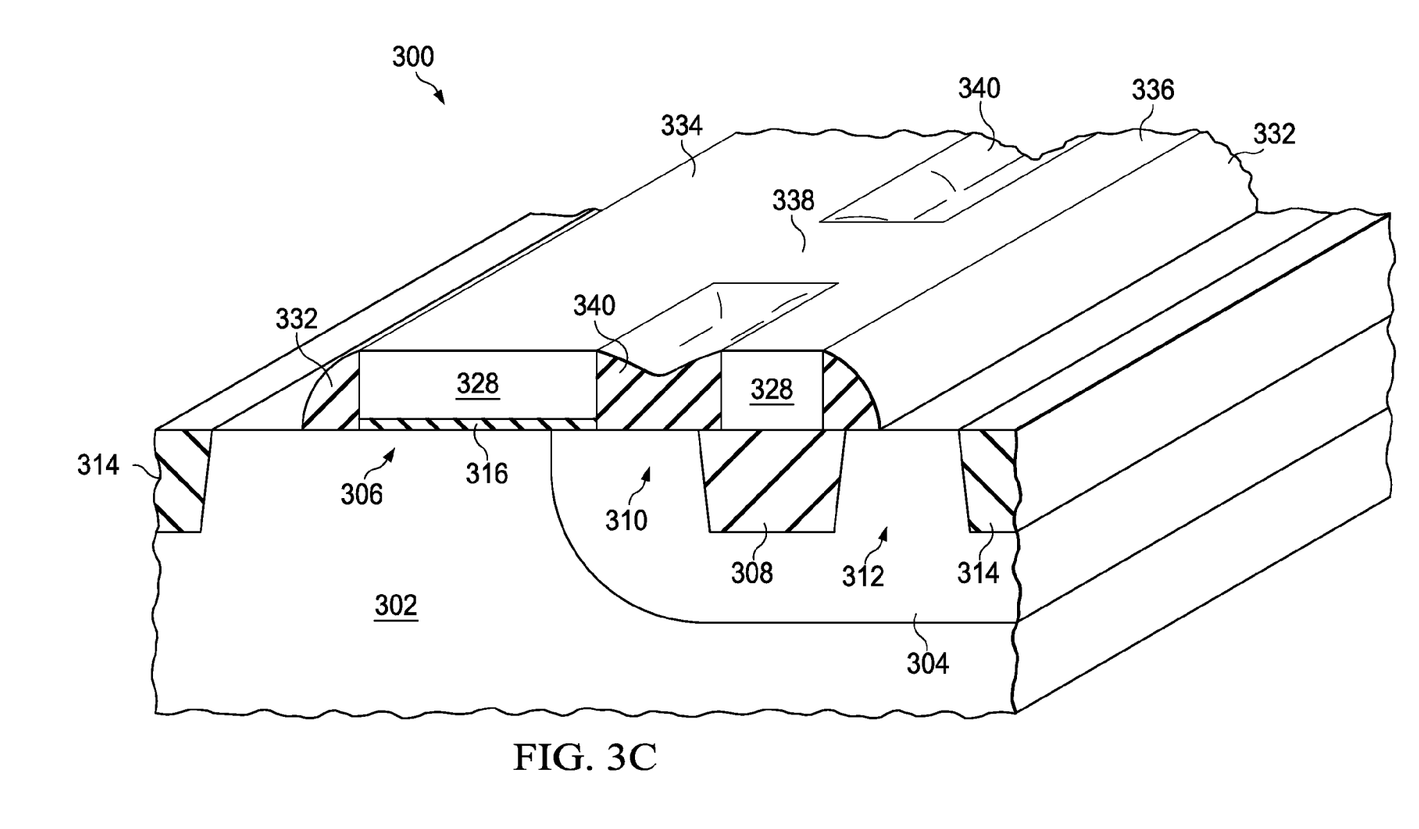

Referring to FIG. 3C, an anisotropic sidewall etch operation, not shown, is performed on the integrated circuit 300 which removes sidewall material of the sidewall material layer 330 of FIG. 3B to form gate sidewalls 332 on lateral surfaces of the gate 328. The gate 328 includes a first gate section 334 over the channel region 306, a second gate section 336 over the drain insulator 308, and possibly gate connecting elements 338 which connect the first gate section 334 to the second gate section 336 as described in reference to FIG. 2. The anisotropic sidewall etch operation also forms an implant blocking section 340 of sidewall material in a gap between the first gate section 334 and the second gate section 336. A minimum thickness of the implant blocking section 340 is at least 50 percent of an average thickness of the gate 328.

Figure 3D:
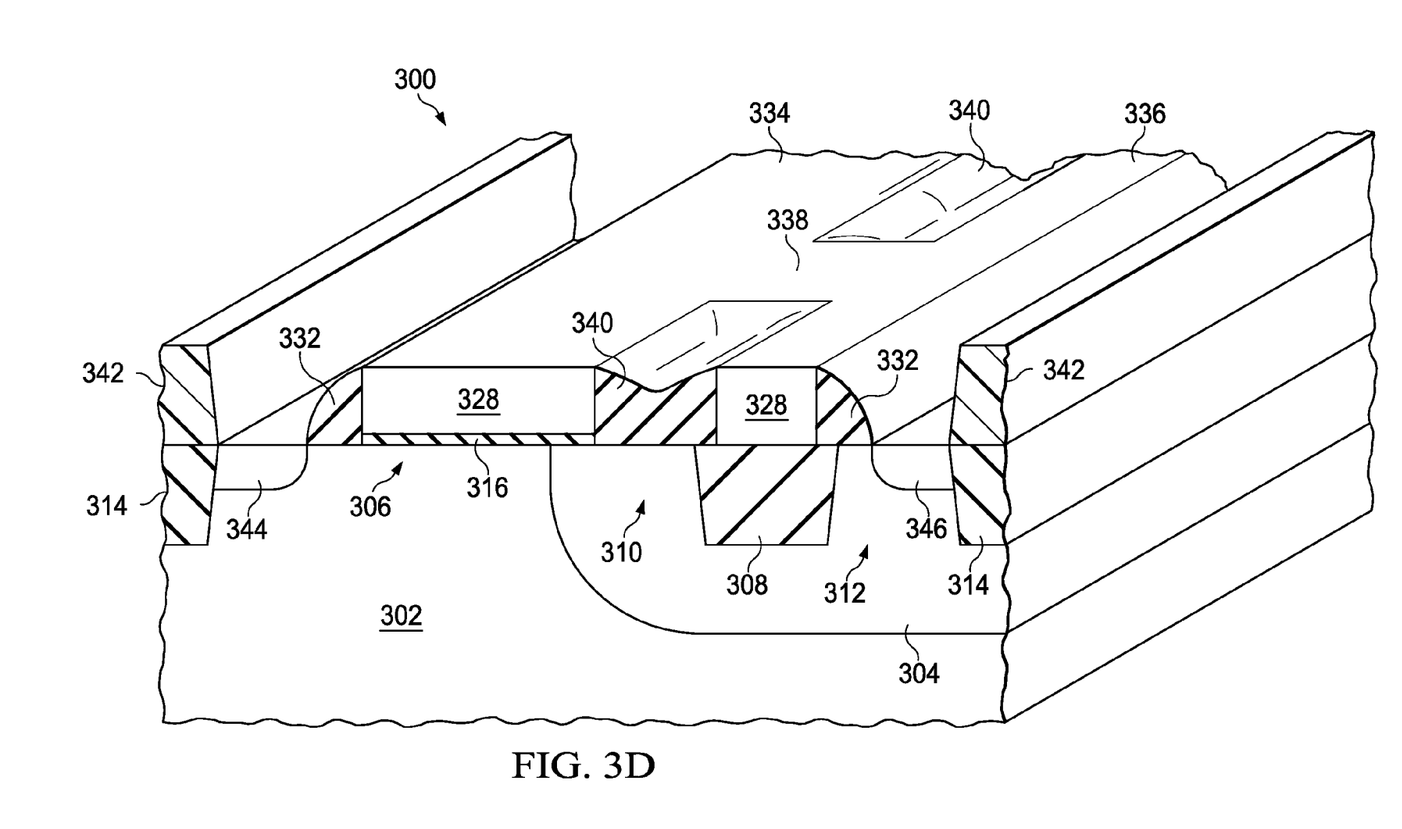

Referring to FIG. 3D, a source/drain implant mask 342 is formed over the integrated circuit 300 which exposes areas for a source/drain ion implant operation. The source/drain implant mask 342 may include for example photoresist or other photosensitive organic material. In the first process embodiment, the implant blocking section 340 is exposed by the source/drain implant mask 342. The source/drain ion implant operation, not shown, implants source/drain dopants into a source implanted region 344 in the substrate 302 adjacent to the channel region 306 opposite the drain region 304. The source/drain ion implant operation may also implant the source/drain dopants into a heavily doped drain implanted region 346 in the drain contact region 312. At least 90 percent of the source/drain dopants impacting the implant blocking section 340 are absorbed in the implant blocking section 340 and thus prevented from depositing in the drift region 310. Subsequent removal of the source/drain implant mask 342 and activation of the source implanted region 344 and the heavily doped drain implanted region 346 if formed produces a structure as described in reference to the first and/or second product embodiments.

Figure 4A:
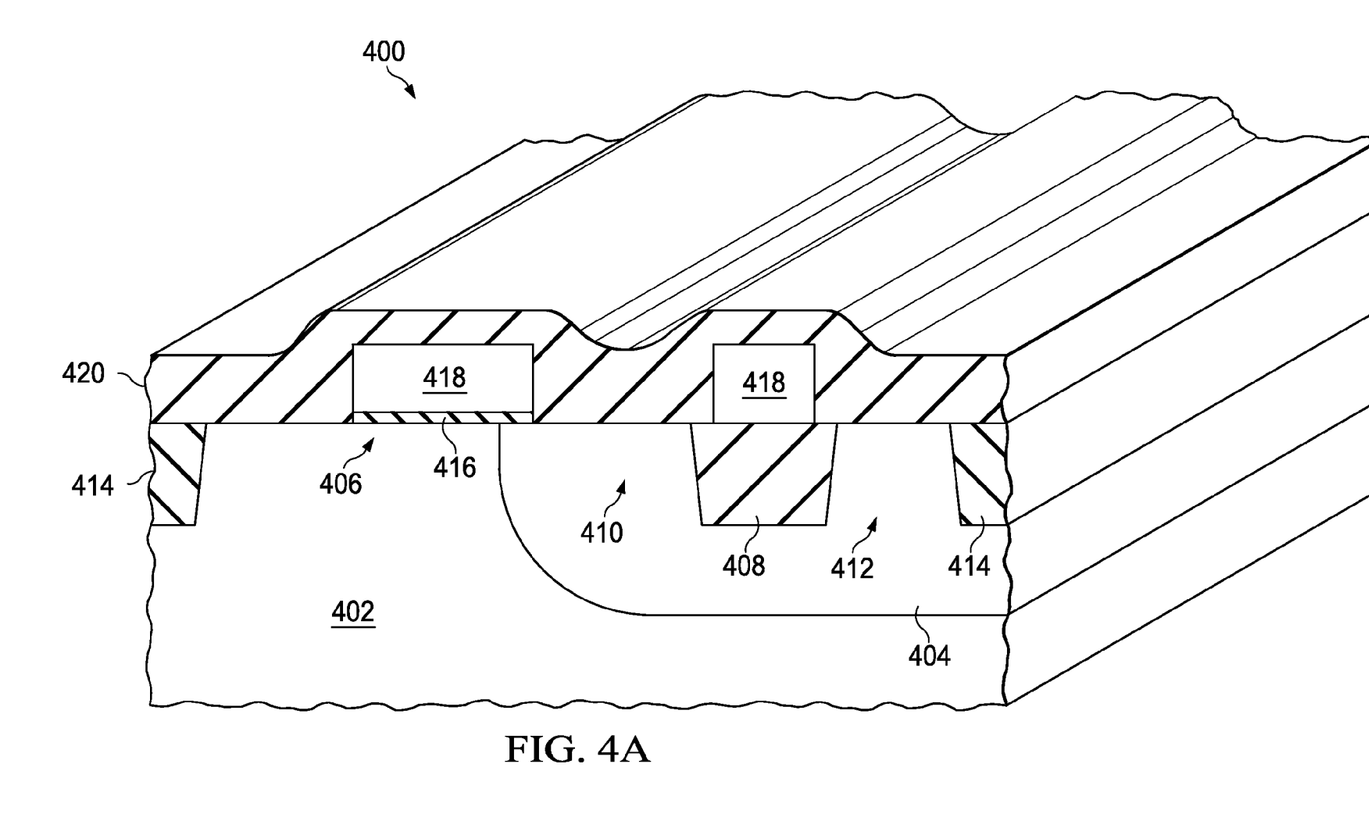
FIG. 4A and FIG. 4B are cross-sections of an integrated circuit containing an MOS transistor as described in reference to either the first product embodiment or the second product embodiment, formed according to a second process embodiment, depicted in successive stages of fabrication.
Figure 4B:
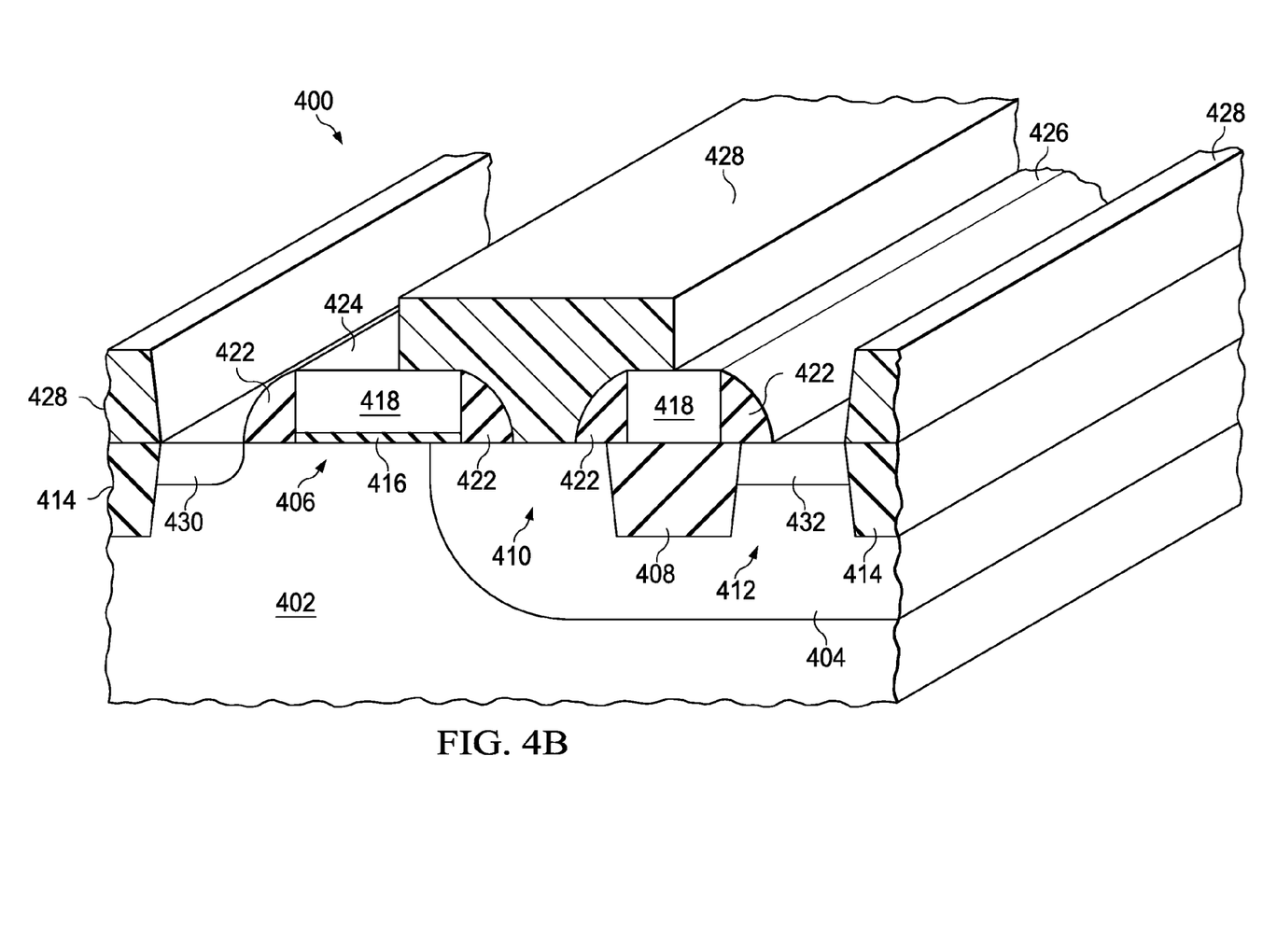

FIG. 4A and FIG. 4B are cross-sections of an integrated circuit containing an MOS transistor as described in reference to either the first product embodiment or the second product embodiment, formed according to a second process embodiment, depicted in successive stages of fabrication. The integrated circuit 400 is formed in and on a substrate 402, as described in reference to FIG. 3A. A drain region 404 formed in the substrate 402, as described in reference to FIG. 3A. The drain region 404 is located abutting a channel region 406 of the MOS transistor. A drain insulator 408 is formed in the drain region 404. The drain insulator 408 may be formed by an STI process, as depicted in FIG. 4A, or by a LOCOS process. A portion of the drain region 404 between the drain insulator 408 and the channel region 406 is a drift region 410. A portion of the drain region 404 adjacent to the drain insulator 408 opposite the drift region 410 is a drain contact region 412. Additional field oxide elements 414 may be formed in the substrate 402 adjacent to the MOS transistor. A gate dielectric layer 416 is formed on a top surface of the substrate 402, as described in reference to FIG. 3A. A gate 418 is formed on the gate dielectric layer 416 as described in reference to FIG. 3A and FIG. 3B. A conformal layer of sidewall material 420, for example one or more conformal layers of silicon nitride and/or silicon dioxide, is formed over the integrated circuit 400.

Referring to FIG. 4B, an anisotropic sidewall etch operation, not shown, is performed on the integrated circuit 400 which removes sidewall material of the sidewall material layer 420 of FIG. 4A to form gate sidewalls 422 on lateral surfaces of the gate 418. In one version of the second process embodiment, the anisotropic sidewall etch operation removes all the sidewall material covering a portion of the drift region 410 between the first gate section 424 and the second gate section 426, as depicted in FIG. 4B. The gate 418 includes a first gate section 424 over the channel region 406 as described in reference to FIG. 3C and a second gate section 426 over the drain insulator 408 as described in reference to FIG. 3C. The gate 418 may also include gate connecting elements, not shown, which connect the first gate section 424 to the second gate section 426 as described in reference to FIG. 2.

A source/drain implant mask 428 is formed over the integrated circuit 400 which exposes areas for a source/drain ion implant operation. In the second process embodiment, the source/drain implant mask 428 covers the gap between the first gate section 424 and the second gate section 426. The source/drain implant mask 428 may include for example photoresist or other photosensitive organic material. The source/drain ion implant operation, not shown, implants source/drain dopants into a source implanted region 430 in the substrate 402 adjacent to the channel region 406 opposite the drain region 404. The source/drain ion implant operation may also implant the source/drain dopants into a heavily doped drain implanted region 432 in the drain contact region 412. In one version of the instant embodiment, at least 90 percent of the source/drain dopants impacting the source/drain implant mask 428 at the gap between the first gate section 424 and the second gate section 426 are absorbed in the source/drain implant mask 428 and thus prevented from depositing in the drift region 410. Subsequent removal of the source/drain implant mask 428 and activation of the source implanted region 430 and the heavily doped drain implanted region 432 if formed produces a structure as described in reference to the first and/or second product embodiments.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a metal oxide semiconductor (MOS) transistor with a drain region adjacent to a channel region of said MOS transistor, said MOS transistor including:

a drain insulator in said drain region between said channel region and a drain contact region in said drain region, so that said drain region extends under said drain insulator;

a drift region in the drain region between the channel region and the drain insulator;

a gate, said gate including:
- a first gate section over said channel region; and
- a second gate section over said drain insulator such that the second gate section does not overlap the drift region;
- the first gate section dimensioned such that at least half of said drift region is not covered by said gate; and
- an implant blocking section between said first gate section and said second gate section, said implant blocking section being formed of gate sidewall material on lateral surfaces of said first gate section and said second gate section.

2. The integrated circuit of claim 1, in which said MOS transistor is n-channel.

3. The integrated circuit of claim 1, in which said MOS transistor is p-channel.

4. The integrated circuit of claim 1, in which said first gate section is not connected to said second gate section by any gate material over said drift region.

5. An integrated circuit, comprising:

an MOS transistor with a drain region adjacent to a channel region of said MOS transistor, said MOS transistor including:

a drain insulator in said drain region between said channel region and a drain contact region in said drain region, so that said drain region extends under said drain insulator;

a drift region in the drain region between the channel region and the drain insulator; and a gate, said gate including:
- a first gate section over said channel region and overlapping said drain region;
- a second gate section over said drain insulator; and
- two or more gate connecting elements each connecting said first and second gate sections, said gate connecting elements being formed of a same material as said first gate section and said second gate section;
- the first gate section dimensioned such that at least half of said drift region is not covered by said gate; and
- an implant blocking section between said first gate section and said second gate section, said implant blocking section being formed of gate sidewall material on lateral surfaces of said first gate section and said second gate section.

6. The integrated circuit of claim 5, in which each said gate connecting element is separated from immediately adjacent gate connecting elements by less than 2 microns.

7. The integrated circuit of claim 5, in which said MOS transistor is n-channel.

8. The integrated circuit of claim 5, in which said MOS transistor is p-channel.

9. The integrated circuit of claim 5, in which said second gate section does not overlap said drift region.

\* \* \* \* \*